US006717855B2

(12) United States Patent
Underwood (10) Patent No.: US 6,717,855 B2
(45) Date of Patent: *Apr. 6, 2004

(54) METHOD AND APPARATUS FOR ALLOWING CONTINUOUS APPLICATION OF HIGH VOLTAGE TO A FLASH MEMORY DEVICE POWER PIN (75) Inventor: Keith F. Underwood, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/318,464

(22) Filed: Dec. 13, 2002

(65) Prior Publication Data

US 2003/0086297 A1 May 8, 2003

Related U.S. Application Data (63) Continuation of application No. 09/751,514, filed on Dec. 29, 2000, now Pat. No. 6,515,901.

(51) Int. Cl.$^7$ .............................................. G11C 16/04
(52) U.S. Cl. .............................. 365/185.18; 365/189.11; 327/536; 327/589
(58) Field of Search ..................... 365/185.18, 189.11, 365/185.28, 185.29; 327/536, 589

(56) References Cited

U.S. PATENT DOCUMENTS

| 5,095,461 | A | 3/1992 | Miyakawa et al. |
| 5,617,359 | A | 4/1997 | Ninomiya |
| 5,812,018 | A | 9/1998 | Sudo et al. |
| 6,038,190 | A | 3/2000 | Kowalski et al. |
| 6,288,941 | B1 | 9/2001 | Seki et al. |

*Primary Examiner*—Hoai Ho
(74) *Attorney, Agent, or Firm*—Blakely, Sokoloff, Taylor & Zafman LLP (57) ABSTRACT According to one aspect of the present invention, an apparatus is provided in which a first switching device is used to connect a first node to a second node and disconnect the first node from the second node based upon the value of a first control signal. The first node is continuously connected to a first voltage source. The first switching device is capable of withstanding continuous application of the first voltage source. A second switching device is used to connect the second node to a third node when the first node is disconnected from the second node and to disconnect the second node from the third node when the first node is connected to the second node.

18 Claims, 8 Drawing Sheets

FIG. 8

METHOD AND APPARATUS FOR ALLOWING CONTINUOUS APPLICATION OF HIGH VOLTAGE TO A FLASH MEMORY DEVICE POWER PIN

CROSS-REFERENCES TO RELATED APPLICATIONS

This is a continuation of U.S. Patent Application No. 09/751,514, filed Dec. 29, 2000 now U.S. Pat. No. 6,515,901. This continuation application claims the benefit of the U.S. Patent Application No. 09/751,514.

FIELD OF THE INVENTION

The present invention relates generally to the field of non-volatile read-only memories. More specifically, the present invention relates to an apparatus, method, and system for allowing continuous application of high voltage to a non-volatile memory device power pin.

BACKGROUND OF THE INVENTION

Metal-oxide-semiconductor ("MOS") flash memory devices typically use memory cells having electrically isolated gates, called floating gates. The floating gates are typically surrounded by a dielectric insulator and formed from a polycrystalline silicon (polysilicon) layer. The electrical insulation is typically provided by a silicon dioxide layer. Information is stored in the memory cell as electrical charge on the floating gates. Charge is transferred through the silicon dioxide layer to the floating gates by a variety of mechanisms such as avalanche injection, channel injection, tunnelling, etc., depending on the construction of the memory cells.

Figure 1:
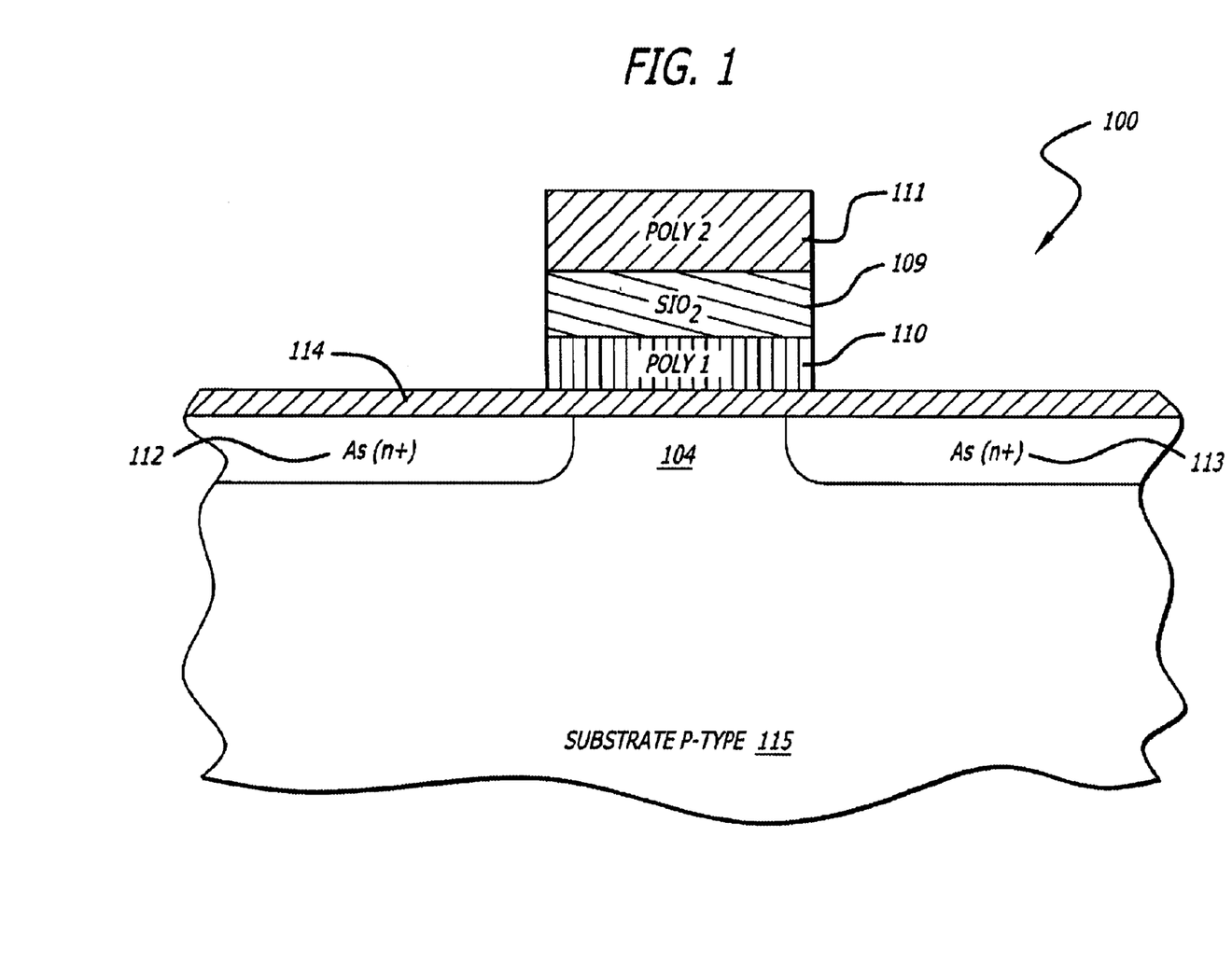
FIG. 1 is a cross-sectional view of a typical floating gate flash EEPROM cell.

A cross-sectional view of a typical floating gate flash EEPROM cell 100 is shown in FIG. 1. In FIG. 1, the flash memory cell 100 is formed on a silicon substrate such as the p-type substrate 115. The flash cell 100 includes a pair of spaced-apart doped regions 112 and 113 disposed in substrate 115. Region 113 comprises a source and region 112 comprises a drain. The source 113 and the drain 112 define an active silicon region 104 and a channel between the source 113 and the drain 112. A polysilicon floating gate 110 is disposed above and between the drain 112 and source 113 and insulated therefrom by a thin layer of silicon dioxide or other electrically insulative layer 114. Insulative layer 114 is generally known as the gate or tunnel oxide, having a typical thickness of approximately 110 angstroms (.ANG.). The floating gate 110 is insulated from a second control gate 111 disposed above floating gate 110 and insulated therefrom by an interpoly dielectric layer 109. Interpoly dielectric layer 109 may be variously formed of a single layer of silicon dioxide, or of an oxide/silicon nitride/oxide multilayer dielectric of appropriate thickness. The control gate 111 is fabricated from a second layer of polysilicon deposited subsequent to the interpoly dielectric layer 109.

Since memory cells and peripheral transistors in a flash memory device have thin tunnel oxide layer, if a high voltage such as 12 volts is continuously applied to these cells and peripheral transistors, degradation or breakdown of the tunnel oxide layer may occur after some time due to the high electric field impressed across the thin oxide. This is especially true with respect to the programming voltage source switches which connect the flash cell transistors to the programming high voltage power supplies (e.g., VPP). Unlike the flash cell transistors in the memory array or peripheral transistors in the program or erase circuitry which only briefly see programming or erase voltages when the respective cells are either programmed or erased, the source switches are constantly, for their lifetimes, exposed to the high programming voltages. To increase circuit speed and packing densities, devices are being scaled more and more. Scaling refers to procedures wherein circuit dimensions and device structures are shrunk in proportion to one another to produce a smaller device which still functions according to parameters known to be functional on larger unscaled devices. One consequence of device scaling is that when all transistor dimensions are reduced, the insulative gate oxide between the substrate channel and the control gate is reduced proportionally. The thinner oxide produced for the scaled array and peripheral devices are problematic for those peripheral devices (e.g., voltage switches) that are exposed to voltages that are higher than voltages applied to the array cells and for longer periods of time. A leading example of devices which suffer as a result of scaling are the transistors that function as source switches connecting flash memory cells to the programming voltage power supplies (e.g., VPP). Whereas the flash memory cells and other peripheral transistors may only be connected to the programming high voltage for a short period of time to program or erase the cells, the source switches are continuously exposed to the high voltage power supply used for programming and erasing the flash memory cells. Because of the limitations just described, current specification for a typical flash memory device includes a constraint that VPP that is greater than a certain voltage level (e.g., 8 volts) can be applied for only a maximum period of time (e.g., 80 hours) over the lifetime of the flash memory device. Consequently, to operate within this constraint, the flash memory device should only be connected to the high voltage VPP for programming or erase operations and should be disconnected from the high voltage VPP source when those operations are done. Such a configuration negatively affects the performance of the flash memory because the VPP source has to be connected to and disconnected from the flash memory device numerous times depending upon whether memory operations requiring the high voltage VPP are being performed. Accordingly, there exists a need for continuous application of high voltage to a flash memory device power pin (e.g., VPP) without damaging the peripheral transistors, especially the switching transistors.

BRIEF DESCRIPTION OF THE DRAWINGS

The features and advantages of the present invention will be more fully understood by reference to the accompanying drawings, in which.

DETAILED DESCRIPTION

In the following detailed description numerous specific details are set forth in order to provide a thorough understanding of the present invention. However, it will be appreciated by one skilled in the art that the present invention may be understood and practiced without these specific details.

In the discussion below, the teachings of the present invention are utilized to implement a method, apparatus, and a system for allowing continuous application of a high voltage (e.g., VPP voltage source) to a non-volatile (e.g., flash) memory device power pin (VPP pin). In one embodiment, a high voltage transistor (referred to as K type, K-MOS, or K-FET transistor herein) which is capable of withstanding the continuous application of the high voltage without having a tunnel oxide breakdown or degradation is used as a first switching device to connect the high voltage VPP to the flash memory internal program/erase power supply node (referred to as the internal VPP or VPPI herein). The first switching device includes a drain terminal, a source terminal and a gate terminal. In one embodiment, the drain terminal of the first switching device is coupled to the VPP, the gate terminal of the first switching device is coupled to an output voltage of a charge pump circuit, and the source terminal of the first switching device is coupled to the VPPI. In one embodiment, the charge pump circuit is coupled to receive a low voltage input such as VCC and a control signal that is used to activate (enable) or deactivate (disable) the charge pump circuit. In one embodiment, the first switching device is switched on when the charge pump circuit is activated or enabled and switched off when the charge pump circuit is deactivated or disabled, based upon the value of the control signal. When the first switching device is switched on or turned on, the VPP is connected to the VPPI which is used for programming or erasing operations for the flash memory array. When the first switching device is switched off or turned off, the VPP is disconnected from the VPP. As a result, the VPP pin can be continuously connected to the high voltage VPP source without causing tunnel oxide damage to the peripheral and switching transistors in the flash memory array. The teachings of the present invention are applicable to any scheme, method and system for voltage switching and voltage regulation in flash and non-volatile memory applications. However, the teachings of the present invention are not limited to flash and non-volatile memory applications and can also be applied to any other circuits, schemes, methods, and systems for voltage switching and regulation.

Figure 2:
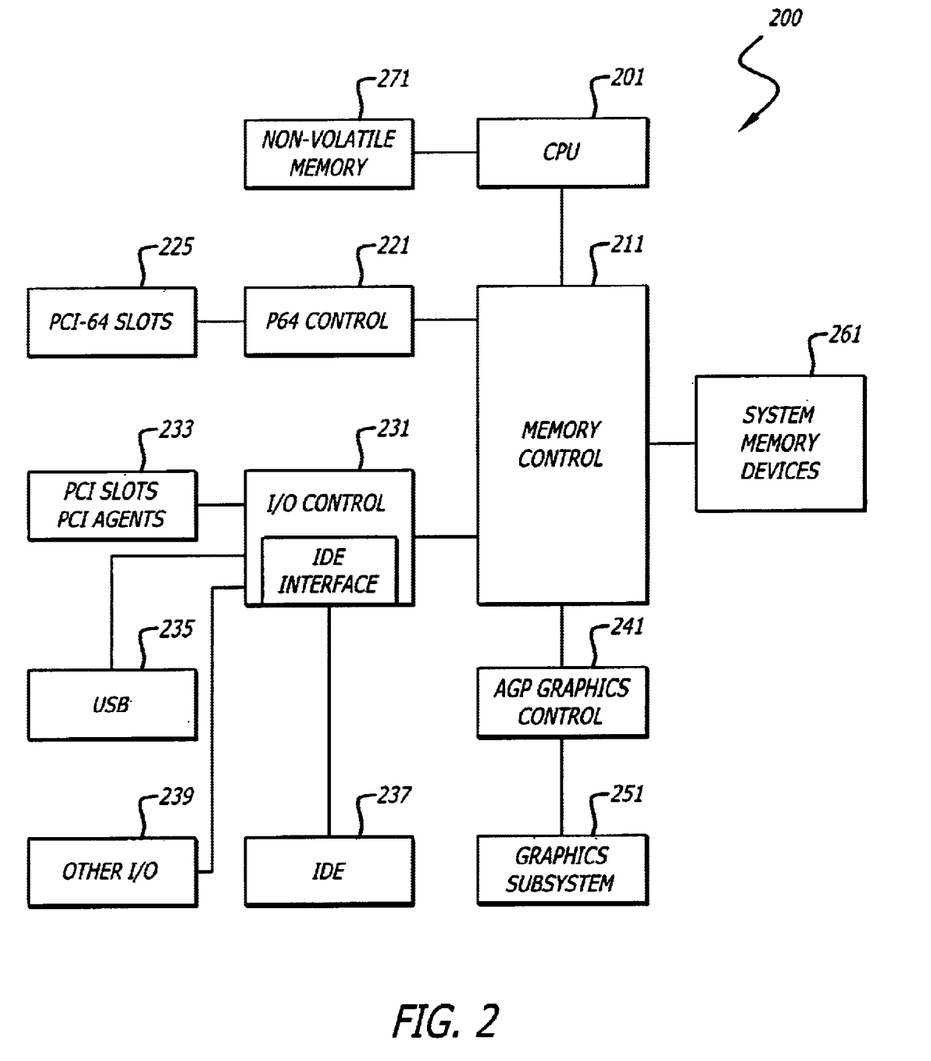
FIG. 2 shows a block diagram of one embodiment of a system in which the teachings of the present invention are implemented.

FIG. 2 shows a block diagram of one embodiment of a system configuration in which the teachings of the present invention are implemented. The system configuration 200 includes one or more central processing unit (CPU) 201, a memory control hub (also referred to as memory control unit or memory controller) 211, a P64 control unit 221, an Input/Output (IO) control unit 231, a graphics controller 241 coupled to a graphics subsystem 251, a plurality of system memory devices 261, and a non-volatile memory device 271. In one embodiment, the non-volatile memory device 271 may include one or more flash memory devices. For the purposes of the present specification, the term "processor" or "CPU" refers to any machine that is capable of executing a sequence of instructions and shall be taken to include, but not be limited to, general purpose microprocessors, special purpose microprocessors, multi-media controllers and microcontrollers, etc. In one embodiment, the CPU 201 is a generalpurpose microprocessor that is capable of executing an Intel Architecture instruction set. The CPU 201, the P64 control unit 221, the IO control unit 231, and the AGP graphics control unit 241 access the system memory devices 261 via the memory control unit 211. The memory control unit 211, in one embodiment, is responsible for servicing all memory transactions that target the system memory devices 261. The memory control unit 211 can be a stand-alone unit, an integrated part of a chipset, or a part of some larger unit that control the interfaces between various system components and the system memory devices 261. The P64 control unit 221 provides the interface control between a plurality of PCI-64 slots 225 and the memory control unit 211. The IO control unit 231 provides the interface control between the memory control unit 211 and various IO devices and ports including the PCI slots and PCI agents 233, a plurality of USB ports 235, a plurality of IDE devices 237, and other IO devices 239. The IO control unit 231, in one embodiment, contains an IDE host interface unit 240 that controls the interface between the IDE devices 237 and the memory control unit 211. The AGP graphics control unit 241 provides the interface control between the graphics subsystem 251 and the memory control unit 211. The IDE host interface unit 240 can be a stand-alone unit, an integrated part of a chipset, or a part of some larger unit that controls the interfaces between various IDE devices 237 and the system memory devices 261.

Figure 3:
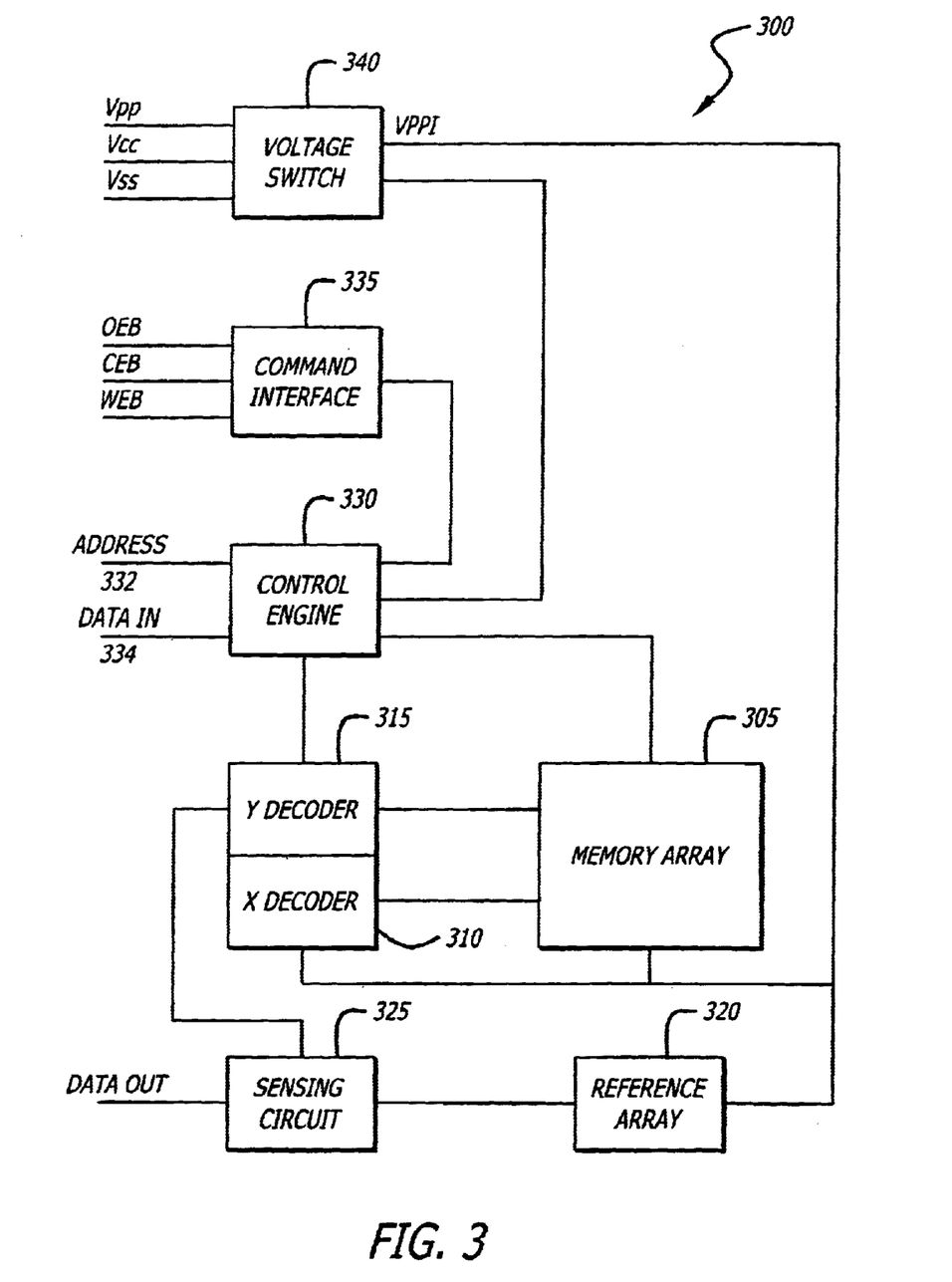
FIG. 3 shows a block diagram of one embodiment of a flash memory configuration according to prior art.

FIG. 3 shows one embodiment 300 of the non-volatile memory device 271 configuration according to the prior art. The non-volatile memory device 271 in this embodiment includes a memory array 305, an X decoder (also called row decoder herein) 310, a Y decoder (also called column decoder herein) 315, a reference array 320, a sensing circuitry 325, control engine 330, command interface 335, and a voltage switch circuit 340. In this embodiment, the memory array 305 includes non-volatile memory cells (not shown) that are used to store data. In one embodiment, the memory cells typically have electrically isolated gates or floating gates that are used to store information in form of electrical charge. The control engine 330 is coupled to receive input addresses via lines 332 and input data via lines 334. Based upon the input addresses, corresponding memory cells are selected using the X decoder 310 and Y decoder 315. For example, to read data stored in the memory array 305, X decoder 310 and Y decoder 315 select a number of corresponding memory cells of the memory array 305 in response to input addresses received via the address lines 332. X decoder 310 is used to select the appropriate row while Y decoder 315 is used to select the appropriate column within memory array 305. Data output from memory array 305 is coupled to Y decoder 315 which passes the data to the sensing circuitry 325. Sensing circuitry 325 compares the states of the selected memory cells to the states of corresponding reference cells of reference cell array 320 to determine the data stored in the selected memory cells. Typically, sensing circuitry 325 includes differential comparators that output digital logic voltage levels in response to the comparisons between the selected memory cells and the reference cells. In one embodiment, the control engine 330 controls the erasure and programming operations of the memory array 305. In one embodiment, control engine 330 controls the operations of the memory array 305 via the control of X decoder 310, Y decoder 315, the sensing circuitry 325, the reference array 320, and the voltage switch circuit 340. In this embodiment, the voltage switch 340 is coupled between an external voltage source (e.g., VPP) and an internal program/erase supply (e.g., VPPI). The voltage switch is operated under the control of the control engine 330 to provide the appropriate voltage levels that are required for various memory operations with respect to the memory array 305 (e.g., programming and erasing operations). For example, during programming operations of the memory cells in the memory array 305, the voltage switch circuit 340 connects the VPP power supply (approximately 12 volts) to the VPPI in order to provide the voltage level required (e.g., 12 volts) for programming operations. Commands for reading, erasure, and programming operations are communicated to control engine 330 via the command interface 335. In one embodiment, various commands are issued to the command interface 335 via three control pins: output enable OEB, write enable WEB, and chip enable CEB.

Figure 4:
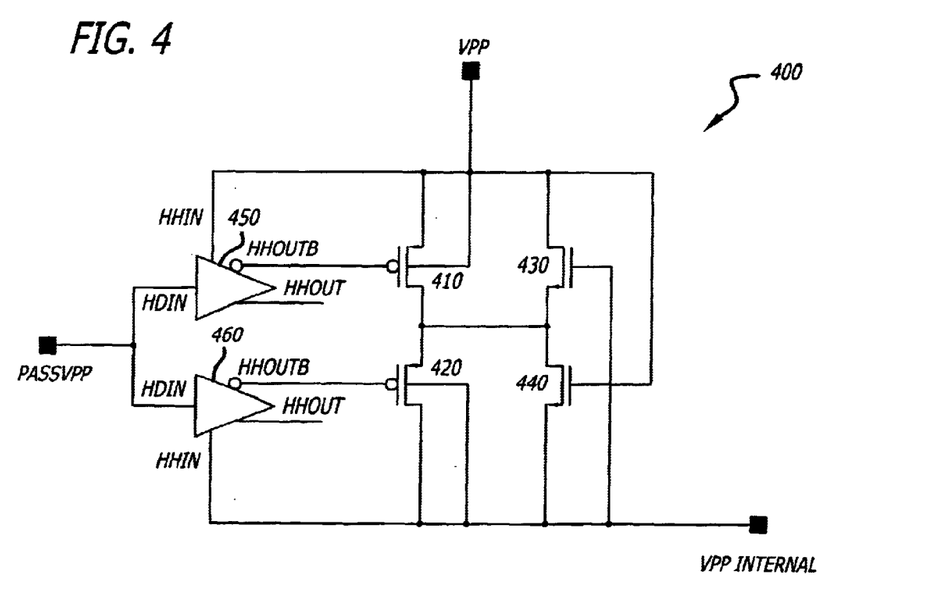
FIG. 4 shows a circuit diagram of one embodiment of the voltage switch circuit.
Figure 5:
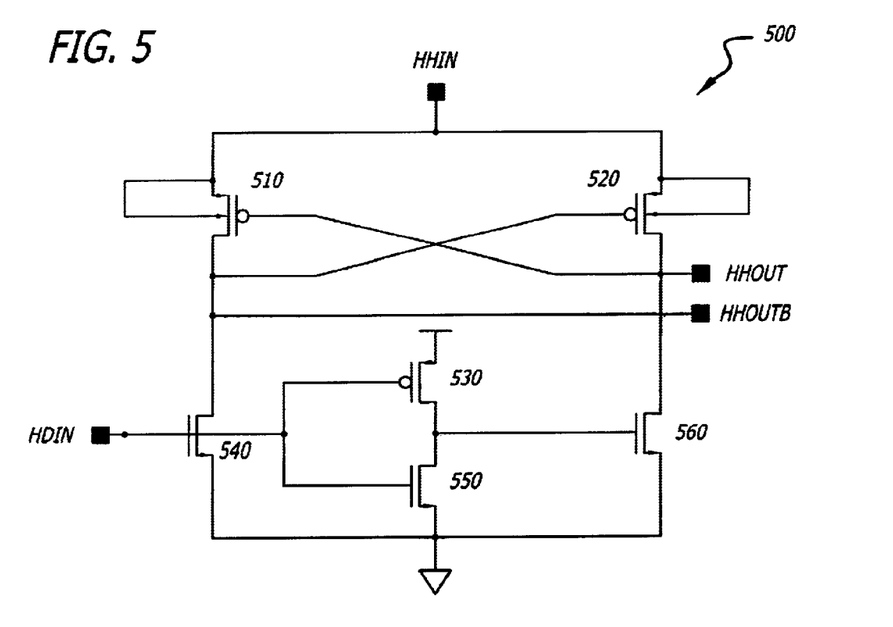
FIG. 5 is a circuit diagram of one embodiment of a level shifter included in the voltage switch circuit.

FIG. 4 illustrates one embodiment of a circuit diagram 400 of the voltage switch 340 according to the prior art. In this embodiment, the voltage switch 340 includes two p-channel field effect transistors (FET) 410 and 420, two n-channel FETs 430 and 440, and two level shifters 450 and 460. As shown in FIG. 4, p-channel FETs 410 and 420 are connected between VPP and VPPI, and n-channel FETs are also connected between VPP and VPPI. The level shifter 450 is coupled between a control signal PASSVPP and the gate terminal of p-channel FET 410. The level shifter 460 is coupled between PASSVPP and the gate terminal of p-channel FET 420. As shown in FIG. 4, each of the two level shifters 450 and 460 has complimentary outputs. The inverted output of level shifter 450 is coupled to the gate terminal of the p-channel FET 410 whereas the inverted output of level shifter 460 is coupled to the gate terminal of p-channel FET 420. The gate terminal of n-channel FET 430 is coupled to VPPI and the gate terminal of n-channel FET 440 is coupled to VPP. In this configuration, the voltage switch 340 is switched on to connect VPPI to VPP and switched off to disconnect VPPI from VPP, based upon the value of the control signal PASSVPP. A detailed circuit diagram of the level shifter 450 or 460 is shown in FIG. 5 which includes p-channel FETs 510, 520, and 530, and n-channel FETs 540, 550, and 560.

Figure 6:
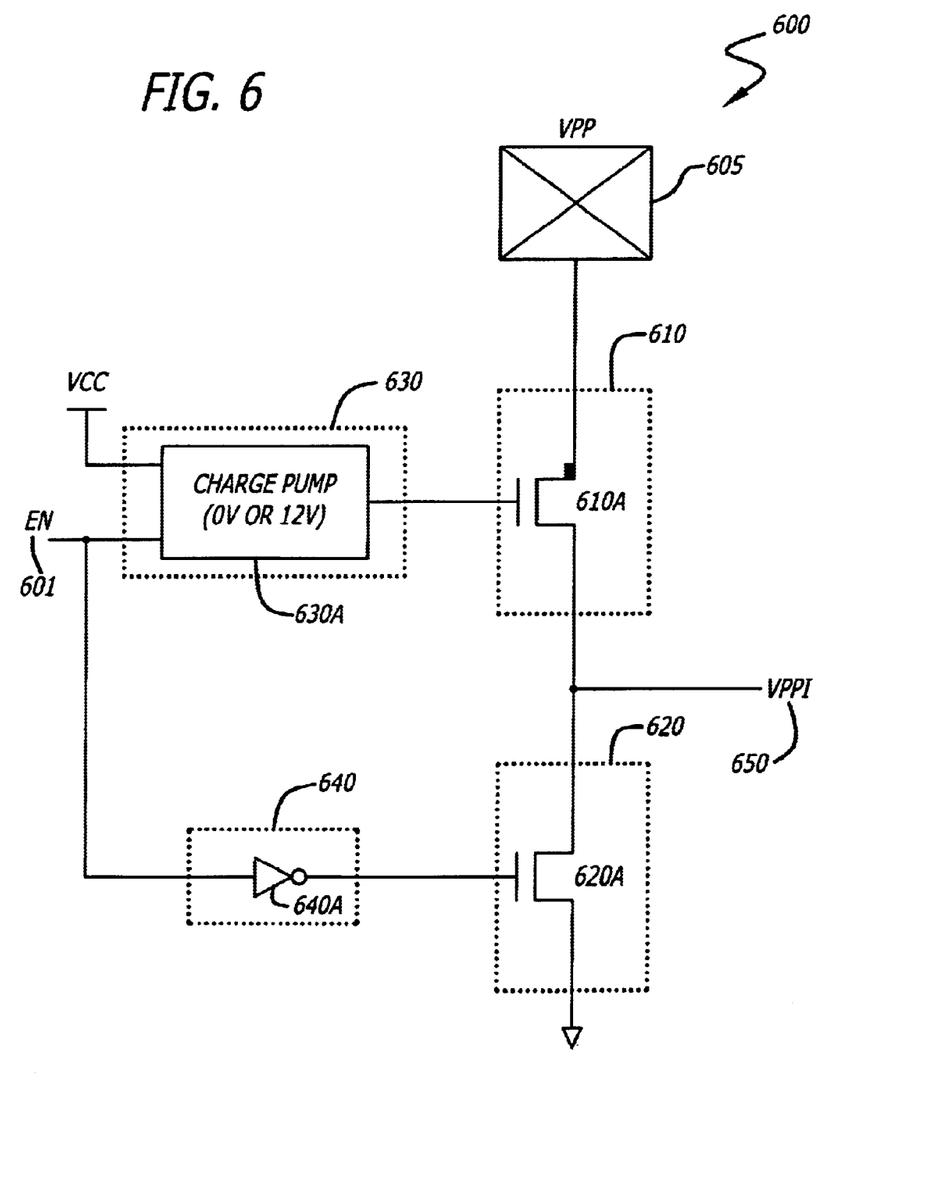
FIG. 6 shows a block diagram of a flash memory configuration according to the teachings of the present invention.

FIG. 6 shows one embodiment of a non-volatile memory configuration 600 according to the teachings of the present invention. In this embodiment, the configuration 600 includes a first switching device 610, a second switching device 620, and a first control device 630, and a second control device 640. The first switching device 610 is coupled between the power supply pin (VPP) 605 of the non-volatile memory device and the internal program/erase supply node (VPPI) 650. In one embodiment, the VPP pin is continuously connected to an external power supply source that provides the voltage level necessary for programming/erasing operations (e.g., 12 volts). In one embodiment, the first switching device 610 is designed to be capable of withstanding continuous application of a certain high voltage such as 12 volts. In one embodiment, the first switching device 610 comprises a specially designed transistor 610A (also referred to as K type, K-MOS, or K-FET herein). The K-MOS transistor 610A is capable of withstanding continuous application of a high voltage such as 12 volts. In one embodiment, the K-MOS transistor 610A includes a drain terminal, a source terminal, and a gate terminal. The drain terminal of the K-MOS transistor 610A is coupled to the VPP pin, the source terminal of the K-MOS transistor 610A is coupled to the VPPI, and the gate terminal of the K-MOS transistor 610A is coupled to the first control device 630. In one embodiment, the first switching device 610 is turned on to connect the VPP to the VPPI and is turned off to disconnect the VPP from the VPPI. In one embodiment, the first control device 630 is used to turn the first switching device 610 on or off based upon the value of a first control signal (EN) 601. In one embodiment, the first control device 630 includes a charge pump circuit 630A configured to receive a low input voltage (e.g., VCC) and generate an output voltage sufficiently high to turn on the first switching device 610. In this embodiment, the charge pump circuit 630A is activated when the first control signal 601 is set to a first value (e.g., 5 volts) and deactivated when the first control signal 601 is set to a second value (e.g., 0 volts). Accordingly, the first control signal 601 is used to switch the first switching device 610 on and off via the charge pump circuit 630A.

As shown in FIG. 6, the configuration 600 also includes the second switching device 620. In this embodiment, the second switching device 620 is used to connect the VPPI node to ground level when the VPPI node is disconnected from the VPP pin and to disconnect the VPPI node from the ground level when the VPPI node is connected to the VPP. As such, when the first switching device 610 is turned on, the VPPI node is connected to receive a high voltage level such as 12 volts that is required for certain memory operations such as programming operations. When the first switching device 610 is turned off, the VPPI node is grounded. In one embodiment, the second switching device 620 comprises an N type field effect transistor 620A although other types of transistors may also be used. The N type field effect transistor 620A is turned on or off based upon the value of a control signal. In one embodiment, the first control 601 signal is also used to control the operations of the second switching device 620 although a different control signal may also be used in other implementations or applications. Referring again to FIG. 6, the drain terminal of the N type field effect transistor 620A is coupled to the VPPI while the source terminal of the N type field effect transistor 620A is coupled to ground level. The gate terminal of the N type field effect transistor 620A is coupled to the second control device 640. In one embodiment, the second control device 640 includes an inverter 640A. In this embodiment, the input of the inverter 640A is coupled to the first control signal 601 and the output of the inverter 640A is coupled to the gate terminal of the N type transistor 620A. In this configuration, it can be appreciated that when the first control signal 601 is set to the first value (e.g., 5 volts), the first switching device 610 is turned on and second switching device 620 is turned off and the VPPI is connected to the VPP. When the first control signal 601 is set to the second value (e.g., 0 volts), the first switching device 610 is turned off and the second switching device 620 is turned on thus connecting the VPPI to ground level. From the configuration illustrated in FIG. 6 and the above description, it can be understood and appreciated that while the VPP pin can be continuously connected to a high voltage source such as 12 volts VPP power supply because the first switching device 610 is capable of withstanding continuous application of such high voltage level, the VPPI is not continuously connected to such a high voltage level because of the operations of the first and second switching devices. Accordingly, the VPPI node is only connected to a high voltage during memory operations that requires such a high voltage level (e.g., programming operations). Otherwise the VPPI node is connected to ground level. Thus the peripheral transistors, switching transistors and memory cells that are connected to the VPPI are not continuously exposed to a high voltage source while the VPP power supply pin of the non-volatile memory device can be continuously connected to the high voltage source. The teachings of the present invention therefore allows continuous application of a high voltage such as 12 volts to the power supply pin of the non-volatile memory device without causing the memory cells and other peripheral and switching transistors in the memory device to be continuously exposed to such a high voltage level. The teachings of the present invention thus allows backward compatibility with previous generations of non-volatile memory devices (e.g., flash memory devices).

Figure 7A:
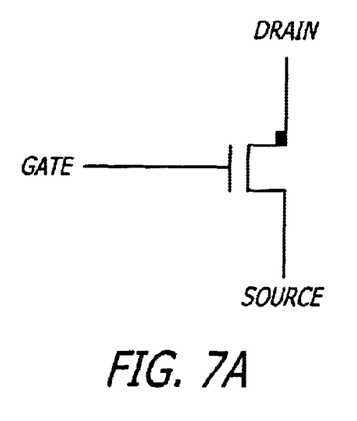
FIG. 7A shows a circuit symbol and FIG. 7B shows a cross-sectional view of a high voltage transistor used as a switching device in accordance with the teachings of the present invention.
Figure 7B:
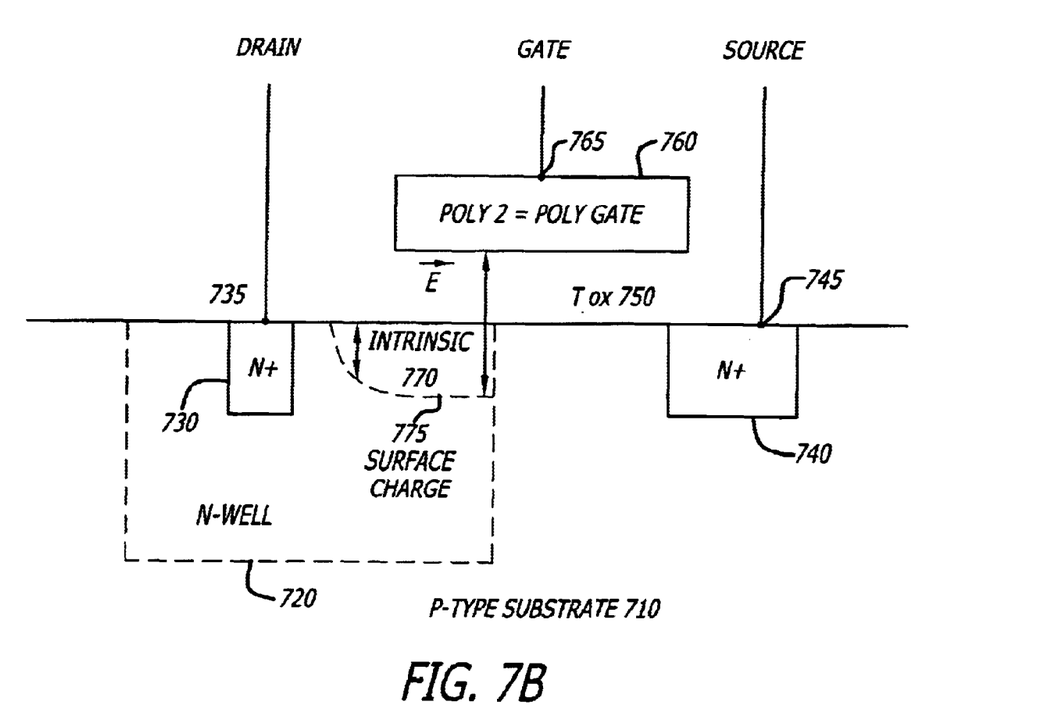

FIG. 7A shows a circuit symbol for the K-MOS device utilized in one embodiment of the present invention and FIG. 7B illustrates a cross-sectional view of the K-MOS device. As shown in FIG. 7B, the K-MOS device is formed on a silicon substrate such as the p-type substrate 710. An N-well 720 is formed in the p-type substrate 710. An N+ region 730 comprising a drain terminal 735 is formed in the N-well 720. The N+ region 730 is more heavily doped than the N-well 720. A second N+ region 740 comprising a source terminal 745 is formed in the p-type substrate 710 as shown in FIG. 7B. A layer of silicon dioxide or other electrically insulative layer (Tox) 750 is deposed on the surface of the p-type substrate 710 joining the N+ regions 730 and 740. A polysilicon layer 760 (referred to as the poly Gate) is deposed above the Tox 750 to form a gate terminal 765. As shown in FIG. 7B, when the drain terminal 735 is connected to a high voltage level (e.g., 12 volts) and the gate terminal 765 is connected to a low voltage level (e.g., ground level), an intrinsic region 770 is formed between the N-WELL region 720 and the poly Gage region 760 with a surface charge or sheet charge 775. As noted above, if a high voltage such as 12 volts is continuously applied to a transistor having only a thin oxide layer, breakdown or degradation of the thin oxide layer may occur after some time due to a high electric field impressed across the thin oxide layer. The K-MOS device structure as shown in FIG. 7B, however, is able to withstand continuous application of such a high voltage level (e.g., 12 volts) because the intensity of the electric field impressed across the oxide layer Tox 750 is significantly decreased due to a larger distance between the gate layer 760 and the sheet charge 775. Thus the K-MOS device having a structure as shown in FIG. 7B can be used as the switching device to connect/disconnect the VPP high voltage source to/from the VPPI and allow the VPP power supply pin of a flash memory device to be continuously connected to the VPP high voltage source (e.g., 12 volts).

Figure 8:
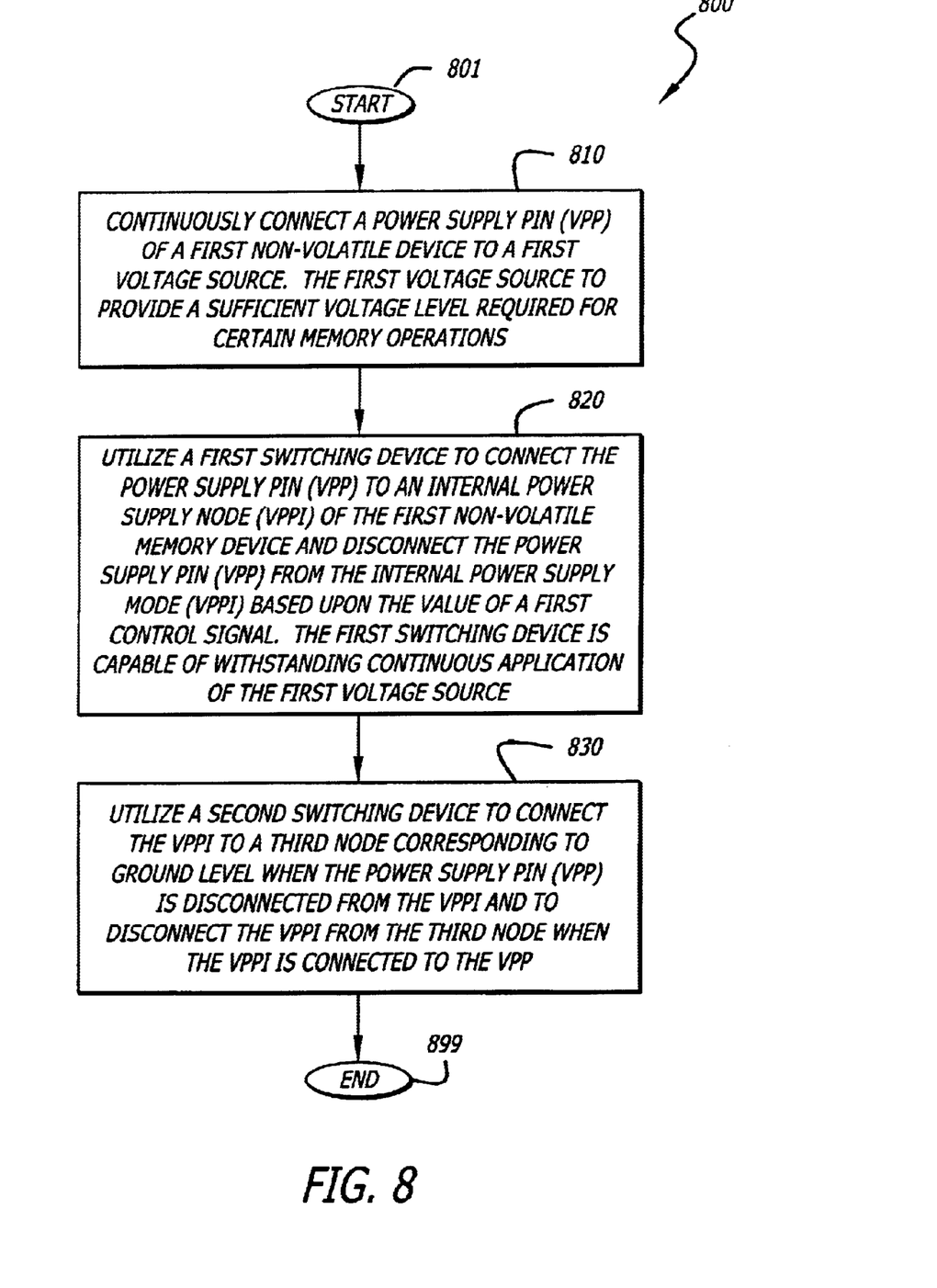
FIG. 8 is a flow diagram of one embodiment of a method according to the teachings of the present invention.

FIG. 8 illustrates a flow diagram of one embodiment of a method according to the teachings of the present invention. At block 810, a power supply pin (VPP) of a first non-volatile memory device such as a flash memory device is continuously connected to a first voltage source. The first voltage source provides a sufficient voltage level required for certain memory operations. For example, in one embodiment, the first voltage source provides 12 volts voltage level that are required for programming operations of the memory cells of the non-volatile memory device. At block 820, a first switching device is utilized to connect/disconnect the power supply pin VPP of the first non-volatile memory device to/from a corresponding internal power supply node of the first non-volatile memory device, based upon the value of a first control signal. In one embodiment, the first switching device is turned on to connect the VPP pin to the VPPI node when the first control signal is set to a first value (e.g., 5 volts) and first switching device is turned off to disconnect the VPP pin from the VPPI node when the first control signal is set to a second value (e.g., 0 volts). In one embodiment, the first control signal is set to the first value during memory operations that requires a sufficient high voltage level provided by the first voltage source and set to the second value otherwise. For example, during programming operations of the memory cells, the first control signal is set to the first value. Once the programming operations are done, the first control signal is set to the second value. This allows the VPP pin to be continuously connected to a high voltage source without continuous exposure of the memory cells and peripheral transistors to such a high voltage level. At block 830, a second switching device is utilized to connect the VPPI node to a third node corresponding to ground level when the VPP pin is disconnected from the VPPI node and to disconnect the VPPI from the third node when the VPPI is connected to VPP. This allows the VPPI node to be connected to the high voltage source during operations that require such a high voltage level and to be connected to ground otherwise. Again, the present invention therefore allows continuous application of a high voltage such as 12 volts to the power supply pin of the non-volatile memory device without causing the memory cells and other peripheral and switching transistors in the memory device to be continuously exposed to such a high voltage level.

The invention has been described in conjunction with the preferred embodiment. It is evident that numerous alternatives, modifications, variations and uses will be apparent to those skilled in the art in light of the foregoing description.

What is claimed is:

1. An apparatus comprising:
    a first switching device having a first terminal, a second terminal, and a third terminal, the first terminal being coupled to a first voltage source at a first node, the second terminal being coupled to a second node, the first switching device comprising a K-type transistor which is capable of withstanding continuous application of the first voltage source;
    a second switching device coupled between the second node and a third node, the second switching device being turned on to connect the second node to the third node when the first switching device is turned off and being turned off to disconnect the second node from the third node when the first switching is turned on; and
    a first control device to turn on and off the first and second switching devices based upon a first control signal having a first value and a second value.

2. The apparatus of claim 1 wherein the first switching device is switched on to connect the first voltage source to the second node and is switched off to disconnect the first voltage source from the second node.

3. The apparatus of claim 1 wherein the K type transistor comprising a drain terminal, a source terminal, and a gate terminal, the drain terminal being coupled to the first voltage source, the source terminal being coupled to the second node, and the gate terminal being coupled to the first control device.

4. The apparatus of claim 3 wherein the first control device comprises a charge pump circuit having an input node and an output node, the input node being coupled to a second voltage source, the output node being coupled to the gate of the K type transistor.

5. The apparatus of claim 1 wherein the first voltage source corresponds to an external power supply for a memory device, the first node corresponds to a power supply pin (VPP) of the memory device, and the second node is coupled to an internal power supply (VPPI) of the memory device.

6. The apparatus of claim 5 wherein the first voltage source provides a voltage level of approximately 12 volts.

7. The apparatus of claim 1 wherein the second switching device comprises an N type field effect transistor comprising a drain terminal, a source terminal, and a gate terminal, the drain terminal being coupled to the second node, the source terminal being coupled to ground level, and the gate terminal being coupled to a first control signal.

8. The apparatus of claim 7 wherein the first switching device is turned on and the second switching device is turned off when the first control signal is set to a first value and vice versa when the first control signal is set to a second value.

9. The apparatus of claim further comprising:
a first inverter coupled between the first control signal and the gate terminal of the second switching device.

10. A system comprising:
a first processor;
a first memory device coupled to the first processor;
first switching device coupled between a first node and a second node of the first memory device, the first node being continuously connected to a first voltage source, the first switching device being turned on to connect the first node to the second node and being turned off to disconnect the first node from the second node, the first switching device comprising a K type transistor which is capable of withstanding continuous application of the first voltage source;
a second switching device coupled between the second node and a third node, the second switching device being turned on when the first switching device is turned off to connect the second node to the third node and being turned off when the first switching device is turned on to disconnect the second node from the third node; and
a first control device to turn on and off the first and second switching devices based upon a first control signal having a first value and a second value.

11. The system of claim 10 wherein the first switching device is turned on when a the first control signal is set to a first value and turned off when the first control signal is set to a second value.

12. The system of claim 11 wherein the second switching device is turned on when the first control signal is set to the second value and turned off when the first control signal is set to the first value.

13. The system of claim 12 wherein the second switching device comprises type field effect transistor having a drain terminal, a source terminal, and a gate terminal, the drain terminal being coupled to the second node, the source terminal being coupled to the third node, and the gate terminal coupled to an activation signal corresponding to an inverted value of the first control signal.

14. The system of claim 10 wherein:
the K type transistor comprises a drain terminal coupled to the first node, a source terminal coupled to the second node, and a gate terminal coupled to a first control device.

15. The system of claim 14 wherein the first control device comprises a charge pump circuit having an input node coupled to a second voltage source and an output node coupled to the gate of the K type transistor.

16. A method comprising:
continuously connecting a power supply pin of a first memory device to a first voltage source, the first voltage source providing a sufficient voltage level for certain memory operations with respect to the first memory device;
connecting the power supply pin to an internal power supply node of the first memory device and disconnecting the power supply pin from the internal power supply node via a first switching device, based upon the value of a first control signal, the first switching device comprising a K type transistor which is capable of withstanding continuous application of the first volt age source;
connecting, via a second switching device, the internal power supply node to a third node when the power supply pin is disconnected from the internal power supply node and disconnecting, via the second switching device, the internal power supply node from the third node when the power supply pin is connected to the internal power supply node; and
controlling, via a first control device, turning on and off the first and second switching devices, the controlling of the turning on and off of the first and second switching devices being based upon a first control signal having a first value and a second value.

17. The method of claim 16 wherein the first switching device is turned on to connect the power supply pin to the internal power supply node when the first control signal is set to a first value and turned off to disconnect the power supply pin from the internal power supply node when the first control signal is set to a second value.

18. The method of claim 17 wherein the second switching device is turned on to connect the internal power supply node to the third node when the first control signal is set to the second value and turned off to disconnect the internal power supply node from the third node when the first control signal is set to the first value.

* * * * *

UNITED STATES PATENT AND TRADEMARK OFFICE
CERTIFICATE OF CORRECTION

PATENT NO. : 6,717,855 B2
DATED : April 6, 2004
INVENTOR(S) : Underwood

It is certified that error appears in the above-identified patent and that said Letters Patent is hereby corrected as shown below:

<u>Column 9,</u>
Line 11, after "claim", insert -- 8 --.
Line 38, after "when", delete "a".

<u>Column 10,</u>
Line 24, delete "volt age" and insert -- voltage --.

Signed and Sealed this

Twelfth Day of April, 2005

JON W. DUDAS
*Director of the United States Patent and Trademark Office*